(12) United States Patent
Melik-Martirosian et al.

(10) Patent No.: US 7,414,277 B1
(45) Date of Patent: Aug. 19, 2008

(54) MEMORY CELL HAVING COMBINATION RAISED SOURCE AND DRAIN AND METHOD OF FABRICATING SAME

(75) Inventors: Ashot Melik-Martirosian, Sunnyvale, CA (US); Takashi Orimoto, Mountain View, CA (US); Mark T. Ramsbey, Sunnyvale, CA (US)

(73) Assignee: Spansion, LLC, Sunnyvale, CA (US)

( * ) Notice: Subject to any disclaimer, the term of this patent is extended or adjusted under 35 U.S.C. 154(b) by 374 days.

(21) Appl. No.: 11/112,884

(22) Filed: Apr. 22, 2005

(51) Int. Cl.
*H01L 21/336* (2006.01)
(52) U.S. Cl. .......... 257/288; 257/E21.43; 257/E21.619; 257/E21.634; 438/300
(58) Field of Classification Search ................ 438/300; 257/E21.43, E21.619, E21.634, 288
See application file for complete search history.

(56) References Cited

U.S. PATENT DOCUMENTS

| | | | | |
|---|---|---|---|---|
| 4,841,347 A | * | 6/1989 | Hsu | ........................... 257/413 |
| 5,312,768 A | * | 5/1994 | Gonzalez | ..................... 438/227 |
| 6,174,775 B1 | * | 1/2001 | Liaw | ........................... 438/283 |
| 6,462,375 B1 | * | 10/2002 | Wu | ............................. 257/316 |
| 6,570,214 B1 | * | 5/2003 | Wu | ............................. 257/315 |
| 6,627,927 B2 | * | 9/2003 | Wu | ............................. 257/213 |
| 6,667,510 B2 | * | 12/2003 | Wu | ............................. 257/319 |
| 6,710,396 B1 | * | 3/2004 | Wu | ............................. 257/315 |
| 6,765,258 B1 | * | 7/2004 | Wu | ............................. 257/315 |
| 2004/0080003 A1 | * | 4/2004 | Lee | ............................ 257/413 |
| 2004/0135210 A1 | * | 7/2004 | Noguchi et al. | ............. 257/368 |
| 2005/0095795 A1 | * | 5/2005 | Son et al. | .................... 438/300 |
| 2005/0176220 A1 | * | 8/2005 | Kanemoto | .................. 438/481 |

* cited by examiner

*Primary Examiner*—George Fourson
(74) *Attorney, Agent, or Firm*—Renner, Otto, Boisselle & Sklar, LLP (57) ABSTRACT

A memory device and a method of fabrication are provided. The memory device includes a semiconductor substrate and a charge trapping dielectric stack disposed over the semiconductor substrate. A gate electrode is disposed over the charge trapping dielectric stack, where the gate electrode electrically defines a channel within a portion of the semiconductor substrate. The memory device includes a pair of raised bitlines, where the bitlines have a lower portion formed by a first process and an upper portion formed by a second process.

30 Claims, 6 Drawing Sheets

Prior Art

MEMORY CELL HAVING COMBINATION RAISED SOURCE AND DRAIN AND METHOD OF FABRICATING SAME

TECHNICAL FIELD

The present invention relates generally to the field of nonvolatile memory devices and, more particularly, to a charge trapping dielectric flash electrically erasable and programmable memory device having raised bitlines with upper and lower portions formed by different processes and a method of fabricating the same.

BACKGROUND

A pervasive trend in modern integrated circuit manufacture is to downscale memory devices so as to increase the amount of data stored per unit area on an integrated circuit memory device, such as a flash memory device. Memory devices often include a relatively large number of core memory devices (sometimes referred to as core memory cells). For instance, a conventional dual cell memory device, such as a charge trapping dielectric flash memory device, is capable of storing two bits of data in a double-bit arrangement. That is, one bit can be stored using a first charge storing region on a first side of the memory device and a second bit can be stored using a second charge storing region on a second side of the memory device.

Figure 1:
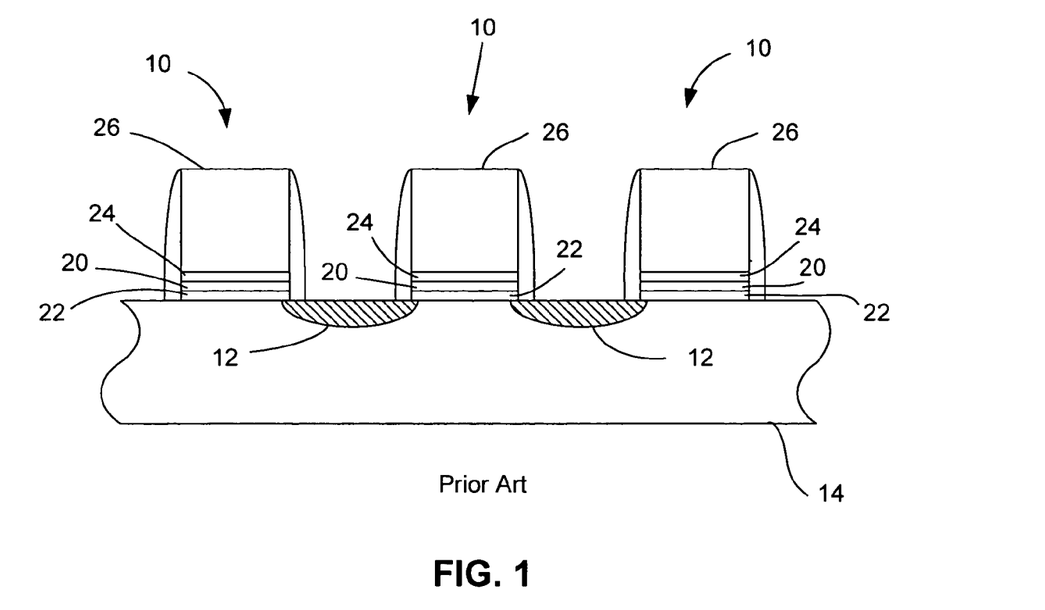
FIG. 1 is a schematic cross-section illustration of a conventional flash memory device.

As shown in FIG. 1, a conventional charge trapping dielectric memory device 10 includes a pair of buried bitlines 12 disposed within a semiconductor substrate 14. A charge trapping dielectric stack, which typically includes a non-conductive charge trapping layer 20 disposed between a bottom dielectric layer 22 and a top dielectric layer 24, is disposed over the semiconductor substrate 14. The charge trapping layer 20 typically includes a pair of charge storing regions on opposite sides of the layer. Over the top dielectric layer 24 is a gate electrode 26. In such a configuration, the buried bitlines function as a source and a drain with an active channel region defined therebetween. Each memory device can be programmed, read and erased by applying appropriate voltages to the source, drain and gate electrode.

Where possible, it is desirable to downscale such memory devices, while still maintaining desirable qualities, such as adequate data retention, and optimizing performance. However, memory device downscaling can result in a number of performance degrading effects. This is especially true when the width (i.e., the lateral dimension) of the gate electrode is comparable to the width of the buried bitlines. Such a memory device is not efficient from a channel length scaling point of view. In other words, the channel length and effective channel length end up being relatively short. Memory devices having a relatively short channel length can experience a number of undesirable electrical characteristics referred to as short channel effects (SCE). SCE generally occur when the gate electrode does not have adequate control over the active channel region. As the physical dimensions of the device decrease, SCE can become more severe.

In view of the foregoing, there is a need for improved memory devices and methods of fabricating such devices, such as charge trapping dielectric flash memory devices that optimize scale and performance.

SUMMARY OF THE INVENTION

According to one aspect of the invention, the invention is directed to a method of fabricating a memory device. The method includes providing a semiconductor substrate; forming a charge trapping dielectric stack over the semiconductor substrate; forming a gate electrode over the charge trapping dielectric stack; and forming raised bitlines on opposite sides of the charge trapping dielectric stack and gate electrode. The step of forming raised bitlines includes forming a lower portion of each bitline using a first forming process; and forming an upper portion of each bitline using a second forming process.

According to another aspect of the invention, the invention is directed to a memory device. The memory device includes a semiconductor substrate; a charge trapping dielectric stack disposed over the semiconductor substrate; a gate electrode disposed over the charge trapping dielectric stack, where the gate electrode electrically defines a channel within a portion of the semiconductor substrate; and a pair of raised bitlines, the bitlines having a lower portion that is formed by a first process and an upper portion that is formed by a second process.

According to another aspect of the invention, the invention is directed to a method of forming bitlines for a semiconductor device. The method includes patterning a plurality of layers formed over a semiconductor substrate, where the patterning forms bitline openings within the layers; forming a lower bitline portion within at least some of the bitline openings using a first forming process; and forming an upper bitline portion over at least some of the lower bitline portions using a second forming process.

BRIEF DESCRIPTION OF DRAWINGS

These and further features of the present invention will be apparent with reference to the following description and drawings, wherein.

DISCLOSURE OF INVENTION

In the detailed description that follows, like components have been given the same reference numerals regardless of whether they are shown in different embodiments of the present invention. To illustrate the present invention in a clear and concise manner, the drawings may not necessarily be to scale and certain features may be shown in somewhat schematic form.

Generally, aspects of the present invention relate to a memory device having raised bitlines and a method of fabricating raised bitlines in which the formation of the raised bitlines is performed in at least two parts based on desired bitline functionality. For example, each raised bitline can be formed such that a lower portion of the bitline is formed using a first process, where the first process (and the bitline portion formed thereby) demonstrates minimal dopant diffusion into a channel region of the device. Continuing with this example, the upper portion of each bitline can be formed using a second process, where the second process (and bitline portion formed thereby) provides a highly conductive bitline region.

While the methods and devices described herein are described with reference to an exemplary memory device, it is to be appreciated that such methods can be applied to the manufacture of any semiconductor device having components that can be formed in multiple process parts, where the process parts are chose to optimize the component and/or device functionality.

Figure 2:
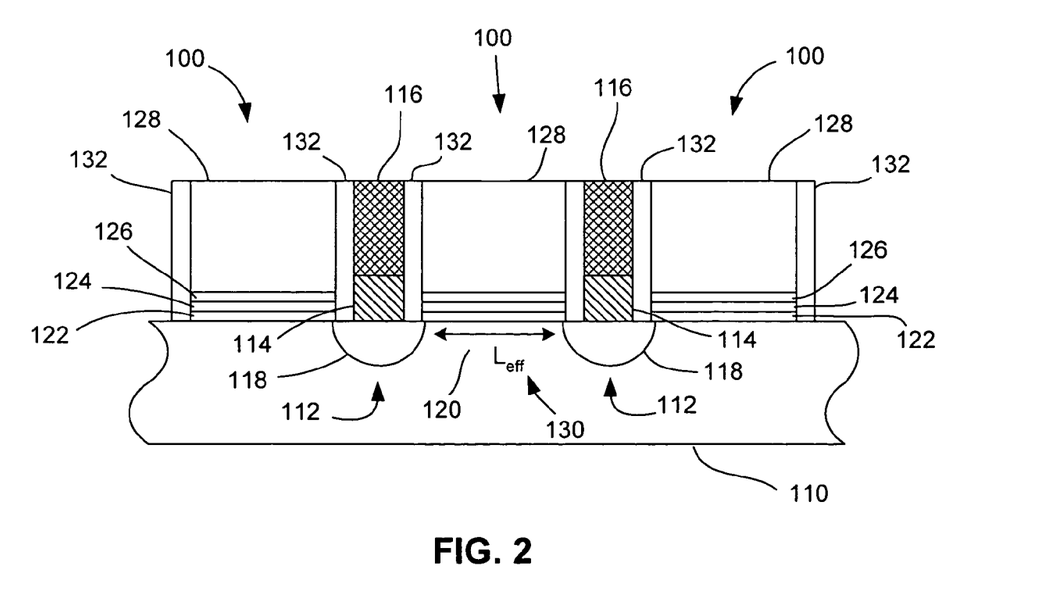
FIG. 2 is a schematic cross-section illustration of a flash memory device having raised bitlines in accordance with an exemplary embodiment of the present invention.
Figure 3:
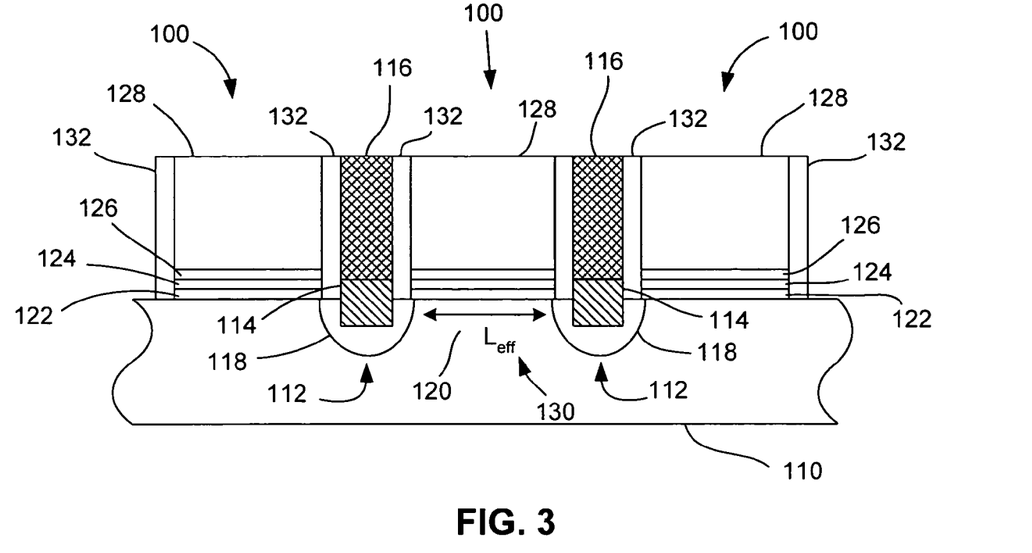
FIG. 3 is a schematic cross-section illustration of a flash memory device having raised bitlines in accordance with another exemplary embodiment of the present invention.

Referring to the drawings wherein like reference numerals designate like parts in the several figures, and initially to FIG. 2 and FIG. 3, an exemplary multiple-bit charge trapping dielectric, non-volatile, flash electrically erasable and programmable memory device generally is illustrated at 100. The memory device 100 (also referred to as a memory cell) can be doped initially to have P-type conductivity (e.g., P dopant concentration). As is discussed more fully below, a pair of bitlines 112 (e.g., also referred to as raised bitlines) can be formed partially within the substrate 110 and/or partially above the substrate. As is discussed more fully below, each bitline 112 can include a lower portion 114 that is formed by a first process, an upper portion 116 that is formed by a second process, and a diffusion portion 118 disposed within the substrate 110. In one embodiment, each bitline 112 functions as a source and a drain, respectively, during various programming, reading, and erasing operations.

A body 120 is formed within the substrate between the source and the drain. The body 120 can have the same dopant type and concentration as the initial doping of the substrate 110. As is described more fully below, the substrate 110, a portion of the source, a portion of the drain and the body 120 can be formed, for example, from a semiconductor, such as appropriately doped silicon, germanium or silicon-germanium.

Above the body 120 is a charge trapping dielectric stack (also referred to as a dielectric stack), which can be made up of several dielectric layers. For purposes of this discussion, the charge trapping dielectric stack is described below in terms of three different dielectric layers. However, it is to be appreciated that the charge trapping dielectric stack can include greater than or fewer than three dielectric or non-conductive layers without departing from the scope of the present invention.

In one embodiment, a first dielectric layer 122 (sometimes referred to as a tunneling dielectric layer or a bottom dielectric layer) can be disposed or otherwise provided above the body 120. The first dielectric layer 122 can be made from, for example, silicon oxide (e.g., $SiO_2$), other standard-K material (e.g., material having a relative permittivity below ten) or a high-K material (e.g., material having a relative permittivity, in one embodiment, above ten and, in another embodiment, above twenty).

Over the bottom dielectric layer 122 is a charge trapping layer 124 (also referred to as a charge storing layer). The charge trapping layer 124 can be made from, for example, a non-conductive material, including silicon nitride (e.g., $Si_3N_4$), silicon oxide with buried polysilicon islands, implanted oxide and the like. Over the charge trapping layer 124 is another dielectric layer 126 (also referred to as a top dielectric layer) made from a material such as, for example, silicon oxide, other standard-K material or a high-K material.

Over the second dielectric layer 126 is a gate electrode 128 (also referred to as a gate or as a wordline). The gate electrode 128 can be made from, for example, polycrystalline silicon (also referred to simply as poly) or another appropriate material, such as a metal or metal oxide. A work function of the gate electrode 128 controls a channel 130 (e.g., inversion or depletion states) within the body 120. As illustrated, a pair of liners 132 (also referred to as sidewall spacers) can be disposed adjacent lateral sidewalls of the gate electrode 128 and the charge trapping dielectric stack (e.g., the top dielectric layer 126, the charge trapping layer 124 and the bottom dielectric layer 122). The liners 132, in addition to providing electrical insulation between the bitlines 112 (e.g., the upper portions 116 and, optionally, a portion of the lower portions 114 of the bitlines) and the adjacent gate electrodes 132, can be used in the formation of the bitlines (e.g., acting as a sort of mask). In one embodiment, the liners 132 can be substantially uniform in thickness, however, other liner geometries can be employed.

As illustrated, the bitlines 112 can include a lower portion 114 and an upper portion 116. In addition, each bitline 112 can include a diffusion region 118 within the substrate 110. As is described more fully below, the lower portion 114 of each bitline can be formed using a first formation process in order to achieve a desired functionality or desired characteristics, while the upper portion 116 of each bitline an be formed using a second formation process in order to achieve, for example, a different desired functionality or different desired characteristics. Artisans will appreciate that, regardless of which processes are used to form the upper portion 116 and lower portion 114, respectively, that the diffusion region 118 is necessary in order for the memory device or memory cell to function properly (since the diffusion region ensures the necessary gate to junction overlap).

In this description, the bitlines 112 are referred to as "raised bitlines." As used herein, "raised bitlines" can mean any one of the following. In one embodiment, a portion of the bitline (e.g., the upper portion or the lower portion of the bitline) can be disposed at a vertical height above a top surface of the substrate (e.g., above the interface where the bottom of the charge trapping dielectric stack meets the substrate). In another embodiment, a portion of each bitline (e.g., the upper portion or the lower portion of the bitline) can be disposed at a vertical height that is above the vertical height of the charge trapping dielectric stack. In yet another embodiment, a portion of the bitline (e.g., the upper portion of the bitline) can be disposed at a vertical height that is substantially adjacent a top portion of the gate electrode 128.

In one embodiment, the lower portion 114 of each bitline can comprise, for example, highly n-doped (in situ) silicon, which is provided by a selective epitaxial growth (SEG) process, in order to minimize any possible out-diffusion of "n" dopant into the channel region during any subsequent thermal treatment of the bitline or memory device. Conversely, the upper portion 116 of each bitline can be made of a highly conductive material, such as a metal, metal containing compound, and/or appropriately doped semiconductor material, such as silicon (e.g., polysilicon), in order to provide an upper bitline portion that acts as a resistance-lowering portion of the bitline. In one embodiment, the upper portion 116 of each bitline can be made of, for example, a heavily n-doped polysilicon, a silicide, such as cobalt silicide or nickel silicide, or a metal fill, such as a tungsten fill.

In the exemplary embodiment illustrated in FIG. 3, where like components have been given the same reference numeral as those corresponding like components in FIG. 2, the memory device 100 includes bitlines 112 having a lower portion 114, an upper portion 116, and a diffusion region 118, which is within the substrate 110. One notable difference in the exemplary embodiment illustrated in FIG. 3, is that a portion of the lower portion 114 of each bitline is disposed partially within the semiconductor substrate, for example, in a shallow trench. In this embodiment, the upper portion 116 of each bitline can have a larger dimension in the vertical direction (relative to the drawing shown in FIG. 2), which can serve to lower the resistance of the upper portion of the bitline, thereby lowering the overall resistance of the bitline along a direction that is normal or otherwise into the page of FIG. 3. Alternatively, the upper portion 116 of each bitline in the embodiment of FIG. 3 can have the same dimension in the vertical direction (relative to the drawing shown in FIG. 2), which can serve to reduce the aspect ratio (e.g., the height-to-width ratio) of the portion of the raised bitline 112 disposed at a vertical height above a top surface of the substrate.

It is to be appreciated that the device and method described herein can improve the scalability of, for example, a double-bit charge trapping dielectric flash memory device, by allowing for a greater effective channel length ($L_{\it eff}$). A greater effective channel 130 length can provide improved charge separation in double-bit or multiple-bit memory cells, a reduction in complementary bit disturb effects, as well as improved short channel characteristics. This greater effective channel length can be accomplished due to a decreased lateral dimension for the lower portion 114 and, therefore, the diffusion region 118 of each bitline.

In one exemplary embodiment, the lower portion 114 and, optionally, the upper portion 116 of each bitline can have a lateral dimension of about 25 angstroms to about 50 nanometers. In this exemplary embodiment, the diffusion region 118 of each bitline can have a lateral dimension of about 10 nanometers to about 20 nanometers (measured from the edge of the lower portion of the bitline 114). Stated differently, in an exemplary embodiment, the diffusion region 118 of each bitline can have a lateral dimension that is about 10% to about 20% of the length of the channel. Stated differently, (e.g., in an exemplary technology node) including an array of memory devices or memory cells (such as those illustrated in FIG. 2 and FIG. 3) having a pitch of about 180 nanometers, the diffusion region 118 of each bitline can have a lateral dimension that is about 5% to about 10% of the pitch.

Figure 4:
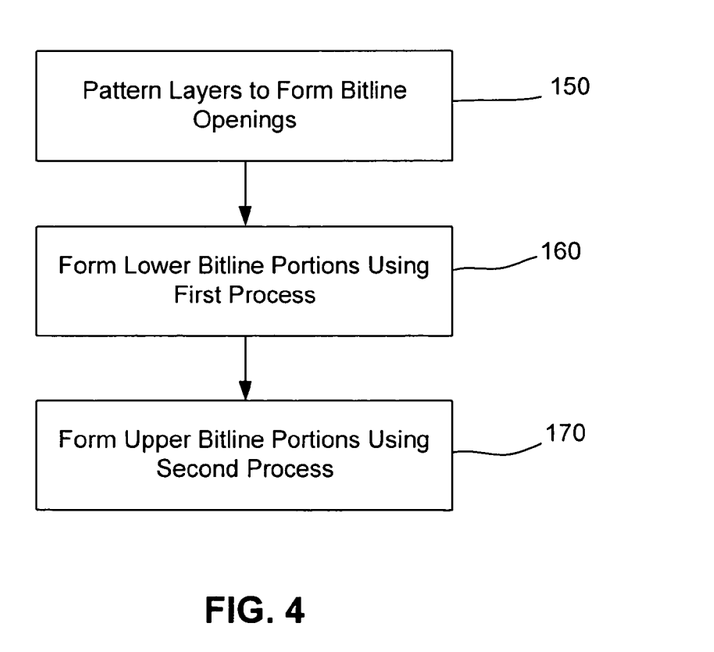
FIG. 4 is a flow chart illustrating a method of forming raised bitlines in a memory device in accordance with an exemplary embodiment of the present invention.

Referring now to FIG. 4, a general overview of a method of forming bitlines in a memory or other semiconductor device is provided. At step 150, a plurality of layers, as is described more fully herein, including, for example, charge trapping dielectric stack layers and gate electrode layers can be provided and patterned to form bitline openings therein. At step 160, lower bitline portions can be formed using a first process, such as, for example, a selective epitaxial growth (SEG) process followed by a hydrogen anneal. At step 170, upper portions of each bitline can be formed using a second process, such as, for example, a fill process using, for example, doped polysilicon, a metal, or a metal-containing compound.

While, for purposes of simplicity of explanation, the methodologies depicted in FIGS. 5-9 are shown and described as a series of steps, it is to be understood and appreciated that the present invention is not limited to the order of steps, as some steps may, in accordance with the present invention, occur in different orders and/or concurrently with other steps from that shown and described herein. Moreover, not all illustrated steps may be required to implement a methodology in accordance with an aspect of the invention. Furthermore, additional steps can be added to the fabrication techniques described herein.

In the following description, which is provided with reference to FIGS. 5-9, analogous process steps are described together. For example, a method of fabricating the exemplary memory device illustrated in FIG. 2 is described with reference to FIGS. 5, 6, 7A, 8A and 9A, while a method of fabricating the exemplary memory device illustrated in FIG. 3 is described with reference to FIGS. 5, 6, 7B, 8B and 9B.

Figure 5:
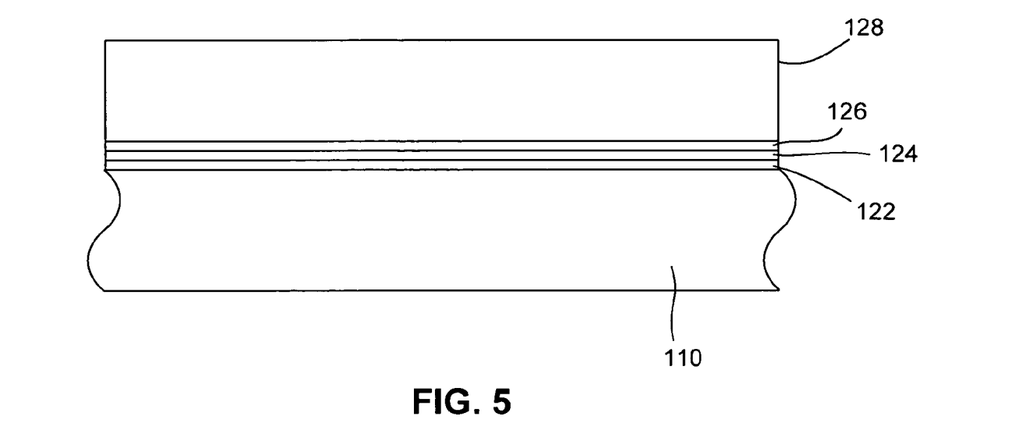
FIGS. 5-9 illustrate side cross-sectional views depicting fabricating steps in accordance with two exemplary embodiment of the present invention.

Referring now to FIG. 5, exemplary methods of fabricating two exemplary memory devices 100 are described in greater detail. As indicated, a semiconductor substrate 110 is provided. The semiconductor substrate 110 can be doped initially with P-type dopant, such as by implanting boron ions, gallium ions or indium ions. As indicated above, the initial substrate doping can provide the desired conductivity for a central portion of the body. In one embodiment, the initial substrate doping can have a "P" concentration, a "P+" concentration or a "P−" concentration. A layer of material used to form the first or bottom dielectric layer 122 can be grown or deposited on top of the substrate 110. It is noted that the bottom dielectric layer can optionally be used as an implant screen during the implantation of dopant species into the substrate 110. In this instance, the bottom dielectric layer can be formed before initial substrate implantation.

As indicated above, the bottom dielectric layer 122 can be formed from an appropriate dielectric material, such as a thermal oxide layer made from silicon oxide (e.g., $SiO_2$), or a high-K material. High-K materials are materials having, a relative permittivity of, in one embodiment, ten or higher and, in another embodiment, of twenty or higher. Although other high-K materials can be selected, hafnium oxide (e.g., $HfO_2$), zirconium (e.g., $ZrO_2$), cerium oxide (e.g., $CeO_2$), aluminum oxide (e.g., $Al_2O_3$), titanium oxide (e.g., $TiO_2$), yttrium oxide (e.g., $Y_2O_3$), and barium strontium titanate (e.g., BST) are suitable high-K materials. In addition, all binary and ternary metal oxides and ferroelectric materials having a K higher than, in one embodiment, about twenty can be used for the bottom dielectric layer 122. The bottom dielectric layer can have a final thickness of, for example, about 40 angstroms to about 400 angstroms, depending upon the material used.

Following formation of the bottom dielectric layer 122, a layer of material used to form the charge trapping layer 124 can be formed on or over the bottom dielectric layer 122. In one embodiment, the charge trapping layer 124 can be formed from silicon nitride (e.g., $Si_3N_4$). Other suitable dielectric materials may also be used to form the charge trapping layer 124. In one exemplary embodiment, the charge trapping layer 124 can have a final thickness of about 20 angstroms to about 100 angstroms.

On top of or over the charge trapping layer, a second or top dielectric layer 126 can be formed. Similar to the bottom dielectric material layer, the top dielectric material layer can be made from an appropriate dielectric, such as silicon oxide or a high-K material. The top dielectric layer can have a thickness of about 20 angstroms to about 150 angstroms.

On top of over the top dielectric layer 126, a gate electrode layer 128 can be formed. The gate electrode layer 128 can be made from, for example, polycrystalline silicon (poly) or another appropriate material, such as a metal or metal oxide. In one embodiment, the gate electrode 128 can have a thickness of, for example, about 300 angstroms to about 2000 angstroms.

The bottom dielectric layer 122, the charge trapping layer 124, the top dielectric layer 126 and the gate electrode layer 128 can be formed uniformly across the substrate 110 in an area used to form a core array of memory devices or memory cells.

Figure 6:
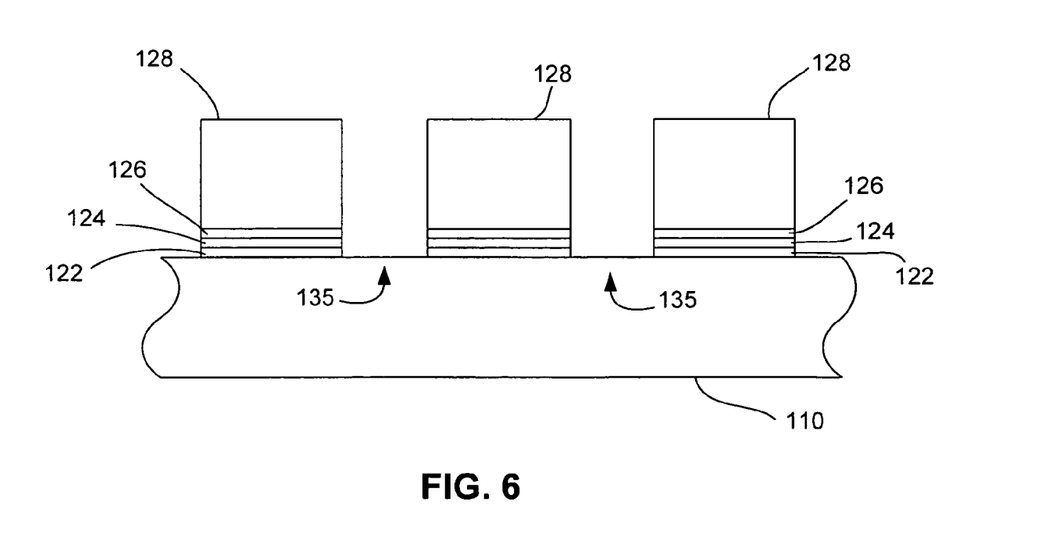

After the layers 122, 124, 126 and 128 have been formed, these layers can be patterned to form stacked gates, as shown in FIG. 6. This patterning step can include forming a mask layer from, for example, a photoresist that is patterned using photolithographic techniques. The mask layer can be patterned into a series of lines and spaces, where the lines cover the layers 122, 124, 126 and 128, where the stacked gates are formed, and the spaces expose the layers 122, 124, 126 and 128, where liners and the bitlines will be formed. The layers 122, 124, 126 and 128 can be etched in areas left exposed by the mask layer to expose the substrate 110. The areas in which the substrate is left exposed are often referred to as bitline openings 135.

Figure 7A:
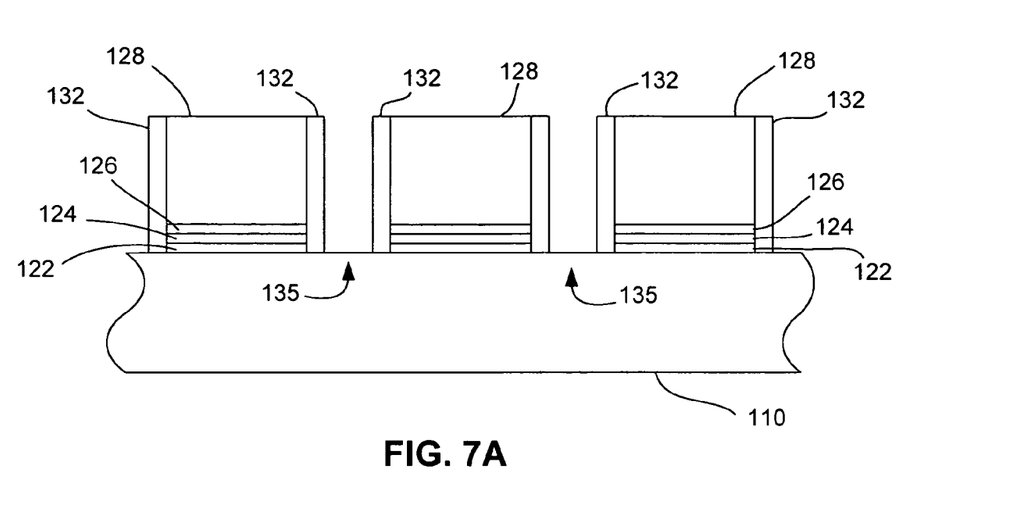
Figure 7B:
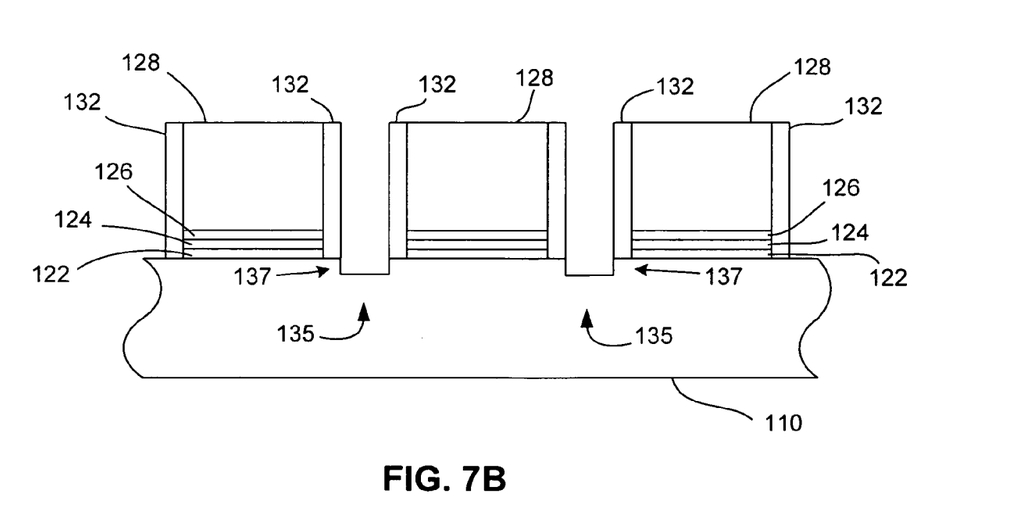

As shown in FIGS. 7A and 7B, once the patterning and/or etching process is complete, liners 132 can be formed. As illustrated, the liners 132 can be formed adjacent the lateral sidewalls of the charge trapping dielectric stack, which is made up of, for example, the bottom dielectric layer 122, the charge trapping dielectric layer 124, the top dielectric layer 126, and the gate electrode layer 128. In the illustrated exemplary embodiments, the liners 132 have a substantially uniform thickness. Alternatively, each liner can have a non-uniform thickness. In one embodiment, the liners can have a thickness of, for example, about 10 nanometers to about 20 nanometers. Of course, liners having other thicknesses can be employed, depending upon the desired technology node, without departing from the scope of the present invention.

The liners 132 can be formed using a variety of techniques. For example, a layer of desired liner material (e.g., silicon nitride, silicon oxide, silicon oxynitride, etc.) can be deposited to at least the height of the gate electrode 128. If desired, the liner material can be polished, using, for example, chemical mechanical planarization or CMP, then, the liner material can be anisotropically etched so that the liners remain, as shown. As illustrated and described herein, formation of the liners adjacent the lateral sidewalls of the charge trapping dielectric stack and the gate electrode layer serve to define a bitline opening 135 having a relatively narrow dimension. In one exemplary embodiment, the bitline opening 135, after the formation of the liners 132, can have a lateral dimension of about 25 nanometers to about 50 nanometers. Of course other lateral dimensions can be provided based on the desired technology node being manufactured.

In the embodiment illustrated in FIG. 7B, trenches 137 can be formed within the semiconductor substrate and can have a lateral dimension of approximately that of the bitline openings 135. In one embodiment, these trenches 137 can be formed in the semiconductor substrate 110 after the formation of the liners 132. Alternatively, sacrificial spacers can be formed substantially in the position of the liners 132 in order to provide a mask for selective etching and formation of trenches in the semiconductor substrate 110.

Figure 8A:
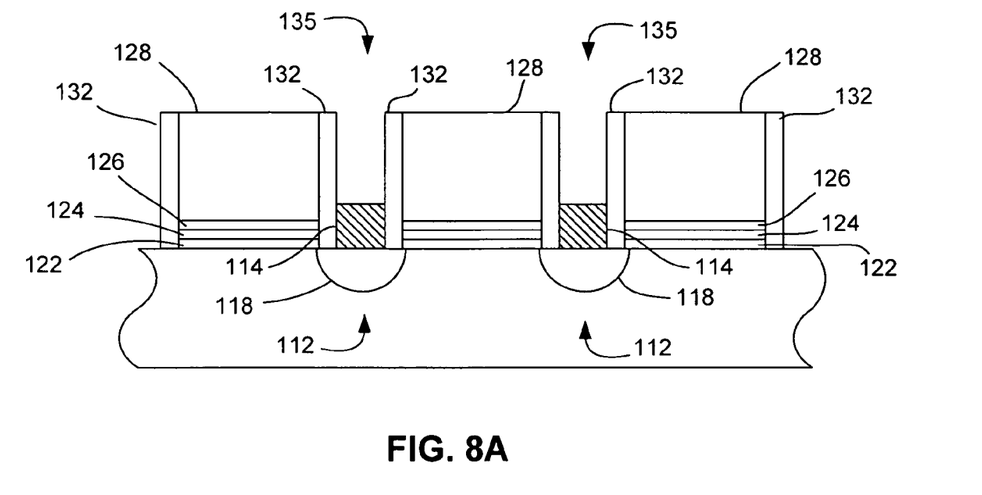
Figure 8B:
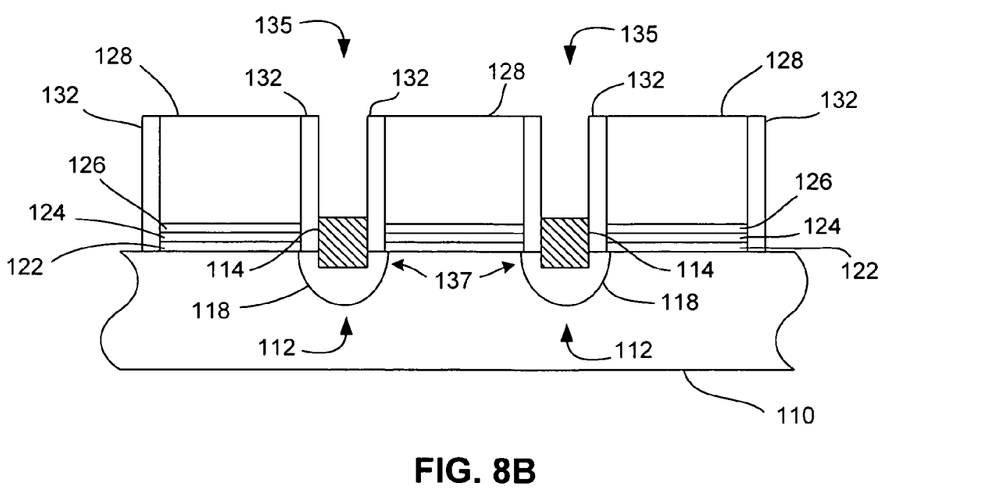

Referring now to FIGS. 8A and 8B, once the liners 132 are formed, the bitlines can be formed. As is described herein, the lower portion of each bitline can be formed using a first process (e.g., a process that serves to minimize diffusion of any dopant into the channel region), while the upper portion of each bitline can be formed using a different process (e.g., a process that serves to provide a highly conductive, resistance-lowering bitline portion).

In one embodiment, the lower portion 114 of each bitline can be formed or otherwise provided by a selective epitaxial growth (SEG) silicon formation process on the surface of the semiconductor substrate 110 within the bitline openings 135 (as illustrated in FIG. 8A) or within the shallow trench 137 formed within the semiconductor substrate 110 (as illustrated in FIG. 8B). In one embodiment, the lower portion 114 of the bitline can be comprised of silicon that is grown or otherwise provided by an SEG process and highly n-doped (in situ) with an appropriate "n" dopant, for example, arsenic or phosphorous. As is described more fully below, the SEG process can be accompanied or otherwise followed by a hydrogen anneal process (e.g., a $H_2$ anneal) for improved redistribution of the grown silicon within the bitline openings 135 on the surface of the semiconductor substrate (as illustrated in FIG. 8A) or within the shallow trench (as illustrated in FIG. 8B).

Artisans will appreciate that providing silicon via an SEG process is relatively well known. For example, one suitable SEG technique can include, for example, an $AsH_3$ dopant, a dichlorosilane (DCS) and HCl at approximately 700-850 degrees Celsius with a growth rate of about 10-400 angstroms per minute. In one embodiment, an $H_2$ anneal process can follow the SEG growth process in order to provide the relatively thin lower bitline portion having a sufficient smoothness or acceptable profile. As is described in more detail herein, the $H_2$ anneal process provides redistribution (also referred to as reflow processing) of the grown and in situ doped silicon on the surface of the substrate (as illustrated in FIG. 8A) or within the shallow trench (as illustrated in FIG. 8B). This $H_2$ process is effective to eliminate voids within the SEG silicon by annealing the doped polysilicon material in hydrogen ambient. By way of example, the n-doped silicon layer (provided by the SEG process) can be annealed at a temperature ranging from about 750 degrees Celsius to about 1,100 degrees Celsius at, for example, a pressure ranging from about 10 Pascals (Pa) to about 40 kilo Pa, and for a time ranging from about 5 seconds to about 60 minutes. It is to be appreciated that the parameters for annealing the silicon lower bitline portion 114 (e.g., temperature, pressure, and time) can be adjusted as necessary without departing from the scope of the present invention.

As shown in FIGS. 8A and 8B, the formation of the heavily n-doped lower portion of the bitline can result in diffusion of the "n" dopant into the semiconductor substrate, thereby providing diffusion regions 118, which, as artisans will appreciate, are necessary for normal device operation. In an alternative embodiment, the methodology described herein with reference to FIGS. 8A and 8B can be preceded by a light initial implant of a "n" dopant into the substrate to form the "n" diffusion regions 118 within the substrate (e.g., to provide a desirable diffusion region profile). In one embodiment the initial light implant can include a "n" dopant implant process through the bitline opening 135 (illustrated in FIGS. 7A and 7B), including a light drain doping (LDD)-type doping, for example, using a phosphorous or arsenic ion species implanted at a dose of, for example, approximately $1 \times e^{14}$ atoms/$cm^2$. In such an alternative embodiment, the anneal cycle associated with one or both of the SEG growth and $H_2$ processes can activate the implanted dopant species. Any such diffusion can be accounted for or otherwise controlled by controlling the implant energy, the implant dose, the anneal cycle parameters, pre-amorphization parameters and the like. The process for formation of the lower portion 114 of the bitlines, as described above, is effective to minimize or otherwise control possible out-diffusion of "n" dopant into the channel region of the substrate during any subsequent thermal treatment of the bitline or remainder of the memory device. Without intending to be bound by theory, this is possible because greater than about 95% of the in situ doped SEG silicon is already activated after the growth and, therefore, dopant movement into the channel is minimized and an abrupt junction can be provided.

Figure 9A:
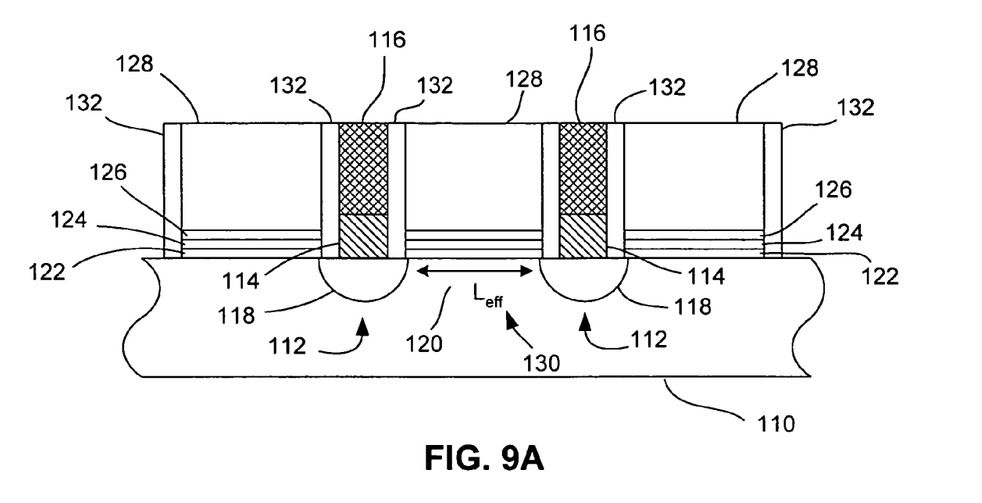
Figure 9B:
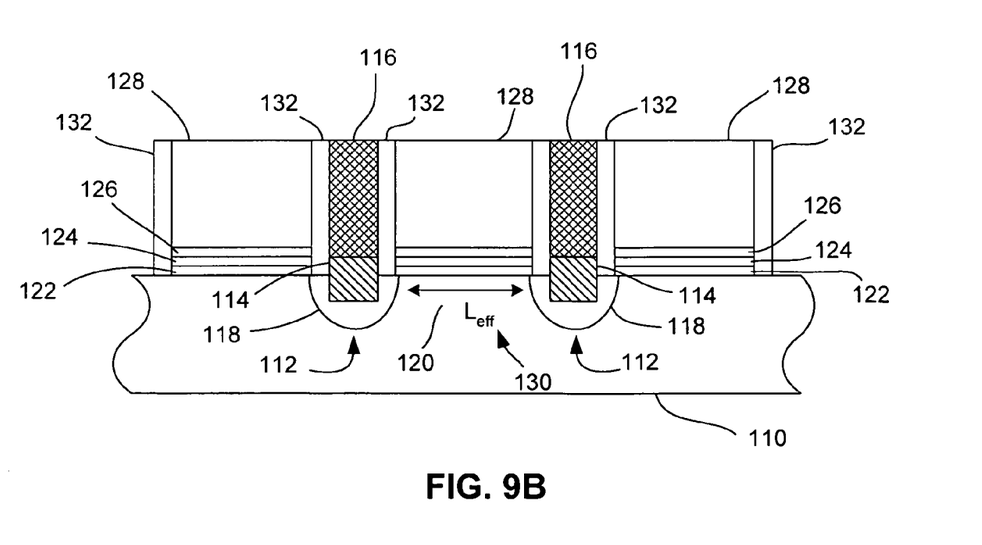

Referring now to FIGS. 9A and 9B, once the lower portion 114 (and the diffusion portion 118) of the bitline are formed, the upper portion 116 of each bitline can be formed using a second process that is different from the above-described first process. In one embodiment, the second process for forming the upper portion of each bitline can be selected based on its functionality or the bitline characteristics provided thereby, for example, providing a highly conductive, resistance-lowering bitline portion.

In one embodiment, the second process to form the upper portion of each bitline can include a fill process of one of a variety of materials, such as heavily-doped polysilicon, a metal, a metal-containing compound, and the like. In one embodiment, the upper portion of each bitline can be provided by a polysilicon fill process, followed by heavy doping with an appropriate "n" dopant, for example, arsenic or phosphorous. Alternatively, the upper portion 116 of each bitline can be formed using an appropriate metal or metal-containing compound fill, such as, for example, a tungsten fill that, optionally, is preceded by deposition of a thin titanium "glue layer." As described above, the shallow trench embodiment (illustrated in FIG. 9B) provides a larger upper portion 116 of the bitline, which can serve to lower the resistance of the upper portion of the bitline (and, therefore, the resistance of the entire bitline) along a direction that is normal or otherwise into the page of FIG. 9B.

As the fill process, which can be used to provide the upper portion of each bitline (whether it be filled with a metal, a metal-containing compound or appropriately doped polysilicon), is relatively well-known to those having ordinary skill in the art, the particular details of the fill process will not be described here in great detail.

Once the upper portion of each bitline is formed, additional processing steps to complete formation of the memory devices can be carried out. Such processing can include formation of electrical contacts brought into electrical communication with the bitlines, deposition of top oxide layers and interlayer dielectrics, formation of wordlines and suitable wordline contacts, and any additional dielectric layers, conductive layers, interconnect layers, and the like.

As should be apparent, the foregoing methods can be modified as desired to form desired properties of the memory device. For instance, the order of steps can be modified, certain steps can be omitted and/or additional steps can be added. In addition, the specified materials, dopant parameters and so forth can be modified.

It should be noted that in interpreting the words "above", "over", and "on top of" in the specification and claims, these words are not intended to be restricted to directly above, directly over or directly on top of, but may include intervening layers between a layer described as being "above", "over", or "on top of" another layer or substrate. For example, the description of a first material above, over or on top of a substrate is not intended to exclude other layers being disposed therebetween.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of fabricating a memory device comprising:
   providing a semiconductor substrate;
   forming a charge trapping dielectric stack over the semiconductor substrate;
   forming a gate electrode over the charge trapping dielectric stack; and
   forming raised bitlines on opposite sides of the charge trapping dielectric stack and gate electrode, the step of forming raised bitlines including:
   forming a lower portion of each bitline using a first forming process; and
   forming an upper portion of each bitline using a second forming process;
   wherein forming the lower portion of each bitline includes:
   forming epitaxially grown silicon within a lower portion of each bitline opening; and
   doping the epitaxially grown silicon in situ.

2. The method of claim 1, further comprising:
   patterning the charge trapping dielectric stack and the gate electrode; and
   forming a pair of liners adjacent lateral sidewalls of the patterned charge trapping dielectric stack and gate electrode, adjacent liners defining a bitline opening.

3. The method of claim 2, wherein the patterning includes forming shallow trenches within the substrate.

4. The method of claim 3, wherein the shallow trenches have a depth of about 25 nanometers to about 100 nanometers.

5. The method of claim 1, wherein the epitaxially grown silicon is doped in situ using phosphorous or arsenic.

6. The method of claim 1, wherein forming the lower portion of each bitline includes:
   forming the epitaxially grown silicon using a selective epitaxial growth (SEG) process.

7. The method of claim 6, wherein forming the lower portion of each bitline further includes:
   performing a hydrogen anneal process following the SEG process.

8. The method of claim 7, wherein the hydrogen anneal process includes annealing the silicon formed by the SEG process in a hydrogen ambient at a temperature between about 750 degrees Celsius and 1,100 degrees Celsius, at a pressure of between about 10 Pascals (Pa) and 40 kiloPA for a time between about 5 seconds and about 60 minutes.

9. The method of claim 6, further comprising:
   before the step of forming epitaxially grown silicon, performing a bitline implant through each bitline opening.

10. The method of claim 9, wherein at least one of the bitline implant and the forming of epitaxially grown silicon provides a diffusion region within the substrate.

11. The method of claim 6, wherein forming the upper portion of each bitline includes:
    filling the upper portion of the bitline opening with at least one of a metal, a metal-containing compound or n-doped polysilicon.

12. A memory device formed according to the method of claim 11.

13. A memory device comprising:
    a semiconductor substrate;
    a charge trapping dielectric stack disposed over the semiconductor substrate;
    a gate electrode disposed over the charge trapping dielectric stack, the gate electrode electrically defining a channel within a portion of the semiconductor substrate; and a pair of raised bitlines, the bitlines having a lower portion that is formed by a first process and an upper portion that is formed by a second process;

wherein the lower portion of each bitline is comprised of in situ n-doped, epitaxially grown silicon.

14. The memory device of claim 13, wherein the upper portion of each bitline has a vertical height that extends substantially adjacent a surface of the gate electrode.

15. The memory device of claim 14, wherein the lower portion of each bitline is disposed at a vertical height that extends above an interface where the bottom of the charge trapping dielectric stack meets the semiconductor substrate.

16. The memory device of claim 15, wherein a portion of the lower portion of each bitline is disposed within the semiconductor substrate.

17. The memory device of claim 16, wherein the portion of the lower portion of the bitline disposed within the semiconductor substrate has a height of about 25 nanometers to about 100 nanometers.

18. The memory device of claim 13, wherein the first process comprises:

forming in situ n-doped silicon using a selective epitaxial growth (SEG) process; and annealing the in situ-doped silicon in a hydrogen ambient.

19. The memory device of claim 18, wherein the upper portion of each bitline is comprised of at least one of a metal, a metal-containing compound or n-doped polysilicon.

20. The memory device of claim 19, wherein the second process comprises:

filling a void above the lower portion of each bitline with at least one of a metal, a metal-containing compound or n-doped polysilicon.

21. The memory device of claim 19, wherein each bitline includes a diffusion region within the semiconductor substrate.

22. The memory device of claim 21, further comprising a pair of liners disposed laterally adjacent sidewalls of the charge trapping dielectric stack and the gate electrode, the liners having a thickness of about 10 nanometers to about 20 nanometers.

23. The memory device of claim 21, wherein the upper and lower portions of each bitline have a lateral dimension of about 25 nanometers to about 50 nanometers.

24. The memory device of claim 23, wherein the gate electrode electrically defines a channel within the substrate between adjacent diffusion regions, the channel having an effective length of about 80 nanometers to about 120 nanometers.

25. The memory device of claim 23, wherein the gate electrode electrically defines a channel within the substrate between adjacent diffusion regions, the channel having a length, and the diffusion region of each bitline has a lateral dimension that is about 10% to about 20% of the length of the channel.

26. An array of the memory devices of claim 23, wherein the pitch of the array of memory devices is about 180 nanometers, and the diffusion region of each bitline has a lateral dimension that is about 5% to about 10% of the pitch.

27. A method of forming bitlines for a semiconductor device, the method comprising:

patterning a plurality of layers formed over a semiconductor substrate, the patterning forming bitline openings within the layers;

forming a lower bitline portion within at least some of the bitline openings using a first forming process; and forming an upper bitline portion over at least some of the lower bitline portions using a second forming process;

wherein the first forming process comprises:

forming in situ n-doped silicon using selective epitaxial growth (SEG) process; and annealing the in situ n-doped silicon in a hydrogen ambient.

28. The method of claim 27, wherein the first forming process provides doped silicon with minimal diffusion.

29. The method of claim 28, wherein the second forming process provides a highly conductive material.

30. The method of claim 29, wherein the second forming process comprises:

filling the remainder of at least some of the bitline openings with at least one of a metal, a metal-containing compound or n-doped polysilicon.

* * * * *